United States Patent [19]

Eidschun, Jr.

[11] 4,064,019

[45] Dec. 20, 1977

[54] CONTINUOUS CONTACT PLATER METHOD

[75] Inventor: Charles D. Eidschun, Jr., Seminole, Fla.

[73] Assignee: Dixie Plating, Inc., St. Petersburg, Fla.

[21] Appl. No.: 666,618

[22] Filed: Mar. 15, 1976

Related U.S. Application Data

[63] Continuation-in-part of Ser. No. 502,536, Sept. 3, 1974, abandoned, and a continuation-in-part of Ser. No. 580,304, May 23, 1975.

[51] Int. Cl.² .......................... C25D 5/02; C25D 5/06
[52] U.S. Cl. ........................................ 204/15; 204/202; 204/224 R
[58] Field of Search ...................... 204/15, 224 R, 202

[56] References Cited

U.S. PATENT DOCUMENTS

| | | | |
|---|---|---|---|
| 3,661,752 | 5/1972 | Capper et al. | 204/206 |
| 3,951,772 | 4/1976 | Bick et al. | 204/15 |
| 3,966,581 | 6/1976 | Holte | 204/15 |

FOREIGN PATENT DOCUMENTS 188,817   12/1966   U.S.S.R. .............. 204/224 R

Primary Examiner—T. M. Tufariello
Attorney, Agent, or Firm—Jack E. Dominik

[57] ABSTRACT

A continuous contact plater is disclosed having a pair of opposed belts for grasping and driving contact points through a pair of opposed jaws to be plated by contact on an anode roller, the same describing a helical trace on the roller. A metering roller is provided to adjustably determine the concentration of the plating fluid on the main roller, and a tray is positioned beneath the anode roller to the end that a porous sleeve on the anode roller constantly passes into the electro-plating solution in the tray. Adjustment means are provided to adjust the roller with regard to the contact points between the opposed belts, the latter being fixed with regard to the frame of the unit.

7 Claims, 9 Drawing Figures

CONTINUOUS CONTACT PLATER METHOD

BACKGROUND OF THE INVENTION

Related Applications

This application is a continuation-in-part of earlier filed application Ser. No. 502,536, filed Sept. 3, 1974, now abandoned and Ser. No. 580,304, filed May 23, 1975.

Field of Invention

The field of the invention includes electrolytic treatment apparatus often found classified in Class 204; and a process of exchanging metal on a workpiece often found classified in Class 204 as well.

Description of the Prior Art

The prior art is exemplified in U.S. Pat. Nos. 936,472; 3,661,752; and 3,904,489; and also in French Pat. No. 331,930 and Patents in Great Britain Patent specification Nos. 760,016 and 18,643 (the latter published in 1899).

In the prior art type devices, rotary members for light frictional engagement with the cathode are shown. Moving contact is also shown for purposes of wiping away bubbles, electrodeposition, and the like, so that the electric plating action will proceed without contamination or film barriers on the surface to be plated. The prior art, however, fails to deal with the modern problems of gold plating, particularly as applicable to the plating of contact points on a curvilinear surface. In the plating of such contact points, the prior art techniques have involved dipping in the anode, and therefore plating portions of the contact which do not require plating. Where precious metals such as gold are employed in the plating, this overplating even to the extent of 100%, doubles the cost of material which is a significant cost in the gold plating of any product. Also because the prior art involves dipping, there is no way of discreetly determining the specific area to be plated, much less determining the exact thickness to be plated on the discreet area.

SUMMARY OF THE INVENTION

The present invention is directed to a method of the discreet plating of a metal on a contact point by passing the contact point along a helical trace on a rotary anode having a porous surface with the part constituting the cathode. In addition, the method depends on a prior step of assembling the contact points on a long bandolier so that the same can be assembled by the hundreds or thousands in an oriented fashion to pass down a linear trace while the rotary member is rotated thereby defining the helical trace along the rotary member. A further step of controlling the amount of electrolyte on the rotary member in combination with the speed of travel of the rotary member as well as the linear travel of the bandolier in a coordinated fashion determines, along with the current density, the exact time sequence relationship to effect the electrodeposition of a predetermined amount of gold on the contact point, as well as the arcuate area to be plated.

The apparatus of the present invention comprises a pair of opposed endless belts in pressure driven relationship to each other, between which the bandolier containing the contact points is secured in opposed tangential relationship to the roller containing, upon its porous surface, a desired amount of electrolyte for plating. Adjustment means are further provided to adjust the spatial relationship between the endless belts and the roller to the end that the arcuate portion of the contact point to be plated can be adjusted.

It is a principal object of the present invention to provide a method for plating a discreet contact point on a carrier of electronic contacts.

A related object of the present invention is to permit the plating on a contact point at only the point where the same will make electrical contact with a plated finger on a printed circuit board, and to control the plated dimensional portion of the contact as well as the thickness of the method being plated.

Still another object of the present invention is to provide for the continuous contact plating of a plurality of contacts secured to a bandolier or carrier, the length of which may be effectively endless.

Still another object of the present invention is to provide an apparatus for achieving all of the above objectives which is readily adjustable in its basic respects, easy to service, and economical to construct, operate and maintain.

DESCRIPTION OF THE DRAWINGS

Further objects and advantages of the present invention will become apparent as the following description proceeds, taken in conjunction with the accompanying drawings in which.

THE METHOD

Figure 9:
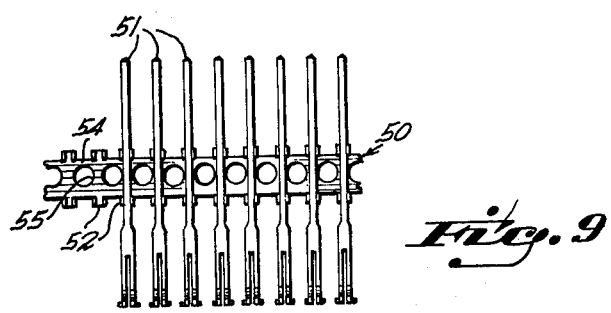
FIG. 9 is a plan view of a typical bandolier of a plurality of contact points.

The method for continuous contact plating of a curvilinear contact point presupposes contacts 51 in a bandolier 50 as shown in FIG. 9. The contact points are positioned so that the bandolier is essentially perpendicular to the contact point. Thereafter the contact points and bandolier are oriented to pass the same along a longitudinal axis. A roller having an absorbent peripheral surface is positioned for driving rotatably with its long axis in parallel relationship to the bandolier, and its longitudinal axis. An electrolytic bath is provided for fluid contact with an absorbent surface on the roller. The bandolier and its contained contact points are then moved along the axis parallel to the axis of the roller with the contact points in tangential contact with the absorbent surface. The resultant action is to follow a helical path along the absorbent surface of the roller with the contact points energized as a cathode, and the electrolytic solution electrically energized, particularly as to the absorbent portion of the roller, as an anode. The method also contemplates means in pressure relationship to the absorbent surface of the roller to control the amount of plating solution that is passed thereabout for purposes of plating.

THE APPARATUS

Figure 1:
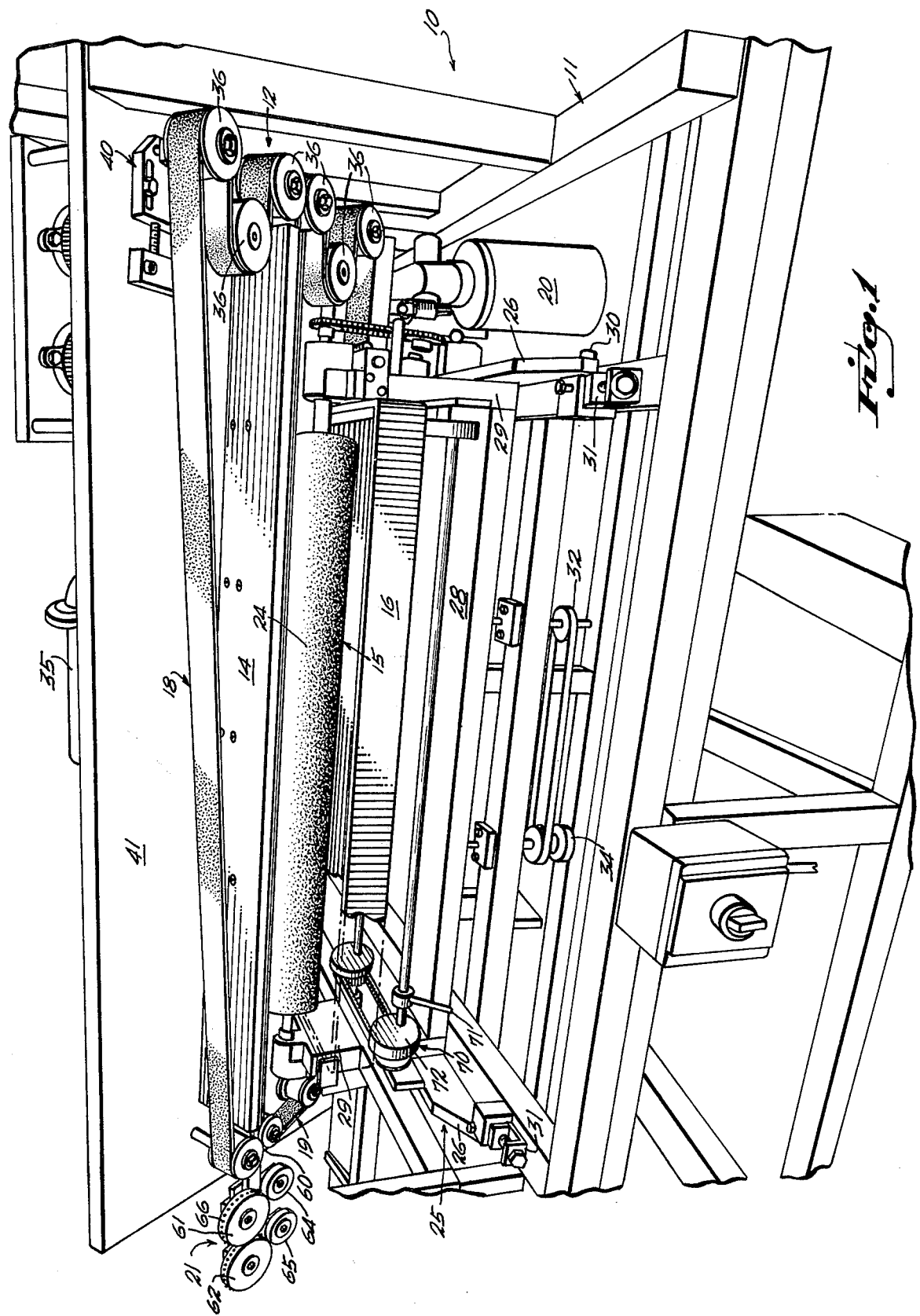
FIG. 1 is a perspective partially broken rear view of the subject continuous plater.

The continuous plater 10 is shown in rear elevation, and perspectively, in FIG. 1. There it will be seen that the continuous plater 10 includes a main frame 11, and a plurality of carrier belts 12. The carrier belts 12 include an upper belt 18 and lower belt 19, which are positioned to tangentially engage each other and pass through the jaws 14 which orient the same for tangential helical trace contact with an anode roller 15. A plating solution tray 16 is positioned beneath the anode roller 15, and provided with an electrolytic solution for purposes of plating, usually plating gold to the contact points. The entire continuous plater 10 presupposes a treatment to the contact points prior to entering the same, and thereafter. It is therefore a continuous plater 10, as a part of a total processing apparatus for contact points.

To be noted in FIG. 1 is the drive motor 20 for the anode roller 15. A feed guide sprocket 21 is provided immediately adjacent the feed point 60, the same being the point where the upper belt 18 and the lower belt 19 first come into contiguous contact for the feeding of the contact points.

Figure 8:
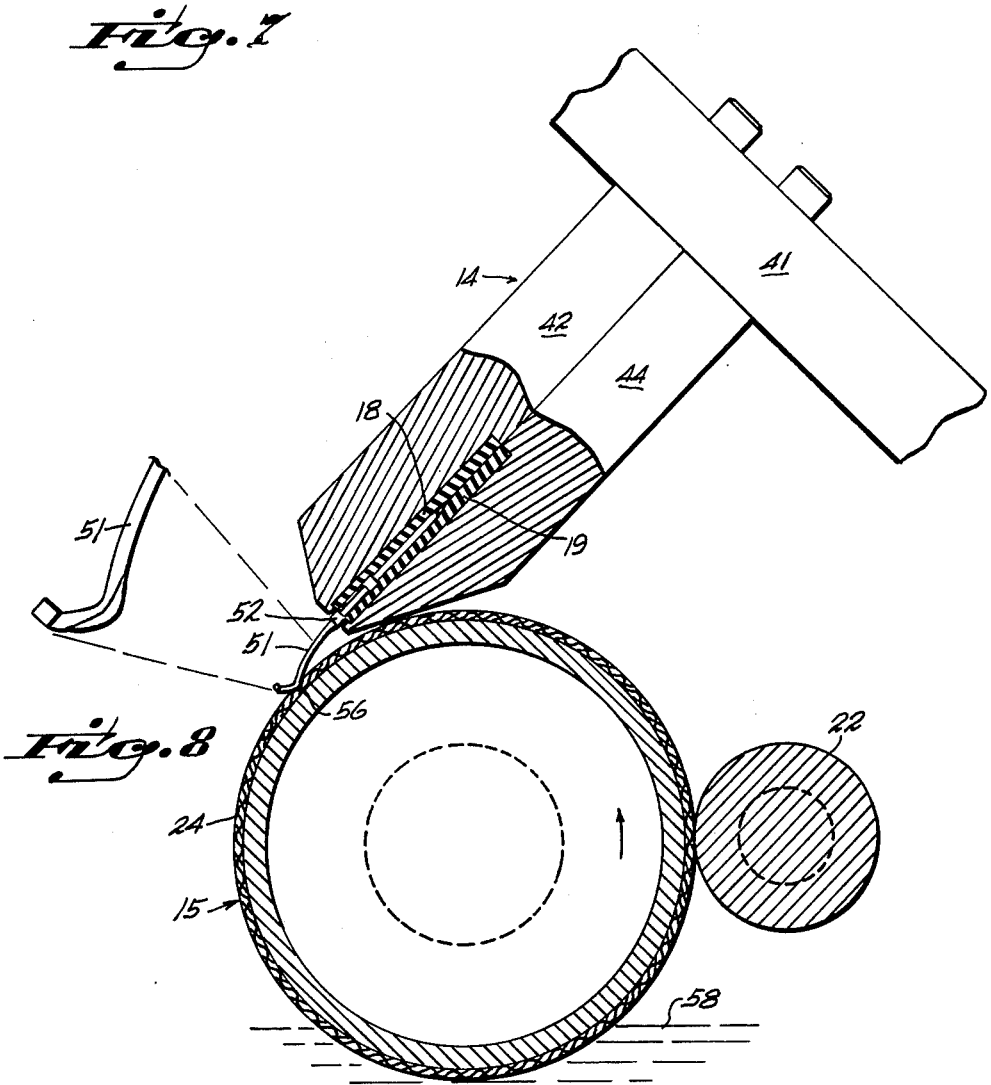
FIG. 8 is an enlarged, partially broken transverse sectional view of the relationship between the jaws, driving belt and roller taken along section line 8—8 of FIG. 7.

Turning now to FIG. 8, it will be seen that the jaws 14 include an upper jaw 42, and a lower jaw 44. The same are secured to jaw bracket 41 which is permanently affixed to the frame 11 of the continuous plater 10. The bandolier 50 is grasped by the opposed upper belt 18 and lower belt 19, and so positioned that the contact point 56 is in contact relationship with the absorbent sleeve 24 of the roller 15. A meter roller 22 is provided for adjustable pressure contact against the porous sleeve 24, so that as the roller passes through the electrolyte 48, the amount of retained fluid after passing the metering roller 22 can be controlled by adjustment. The upper and lower belts 18, 19 may be of a closed cell foam like material, or solid rubber, depending upon the contacts being fed.

The contacts, while generally secured to a bandolier, may take varying forms. As shown in FIG. 9, the bandolier 50 has a plurality of contacts 51 secured thereto by means of a fastener 52, in this instance opposed jaws. The band 54 is provided with a plurality of drive holes 55 which permit the same to be sprocket fed for movement.

Figure 3:
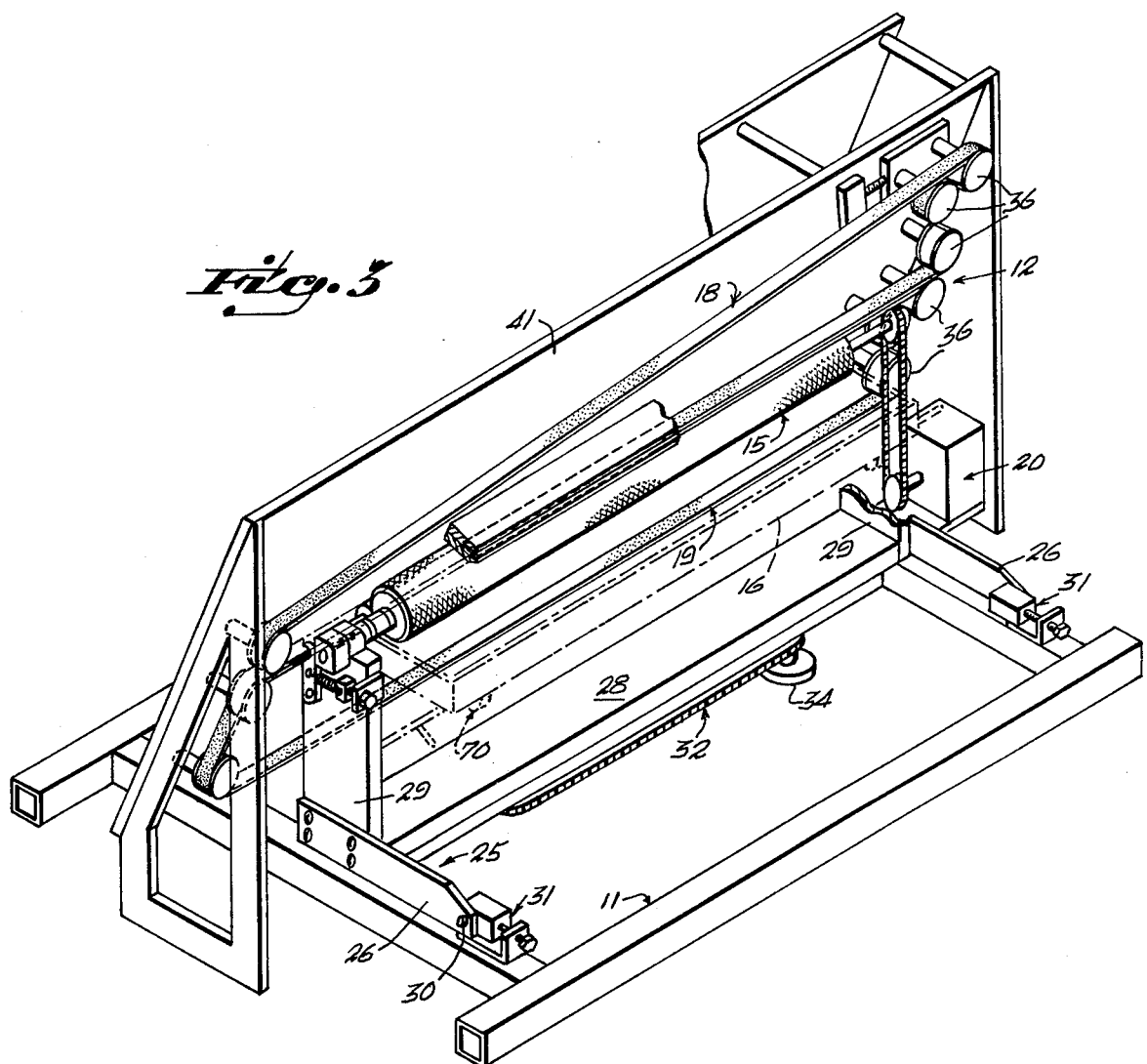
FIG. 3 is a partially diagrammatic broken view of a rear portion of the unit taken in perspective and illustrating particularly the relationship between the opposed jaws, the plating roller and the adjustment of the plating roller.
Figure 4:
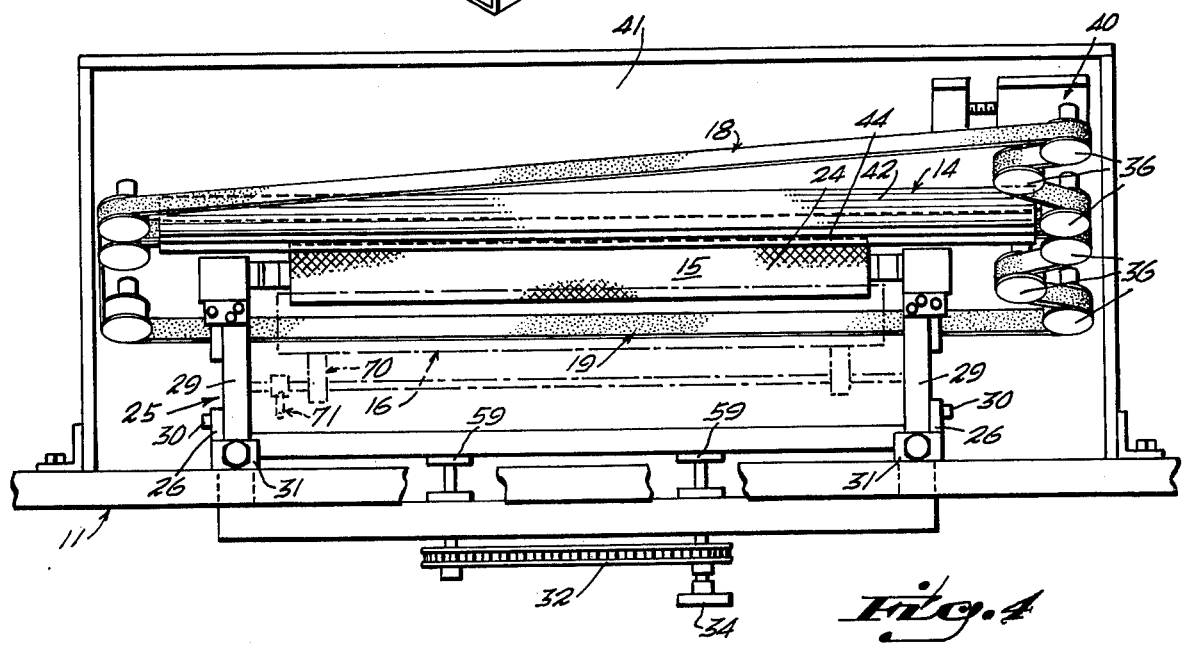
FIG. 4 is a rear elevation of the mechanism shown in FIG. 3 in substantially the same scale.

Turning now to FIG. 3, it will be seen that the roller 15 is secured to a roller frame 25 which includes a pair of roller frame legs 26, a roller frame base 28, and opposed roller frame posts 29 to which the roller 15 is mounted. The roller frame legs 26 are mounted at a pivot 30 to the main frame 11. A horizontal adjusting member 31 is provided at each end of the lower frame 25, immediately adjacent the pivot 30. Vertical adjustment means 32 are provided beneath the base 28 of the roller frame 25, and as noted in FIG. 4, by rotating the knob 34, the pads 59 bear upon the lower face of the base 28, and raise and lower the same. Here it will be appreciated that the adjustment takes a very modest arcuate path, but the same is of no major movement inasmuch as the adjustment of the roller 15 with regard to the position of the jaws 14 and the contained bandolier 50 is empirical.

Figure 5:
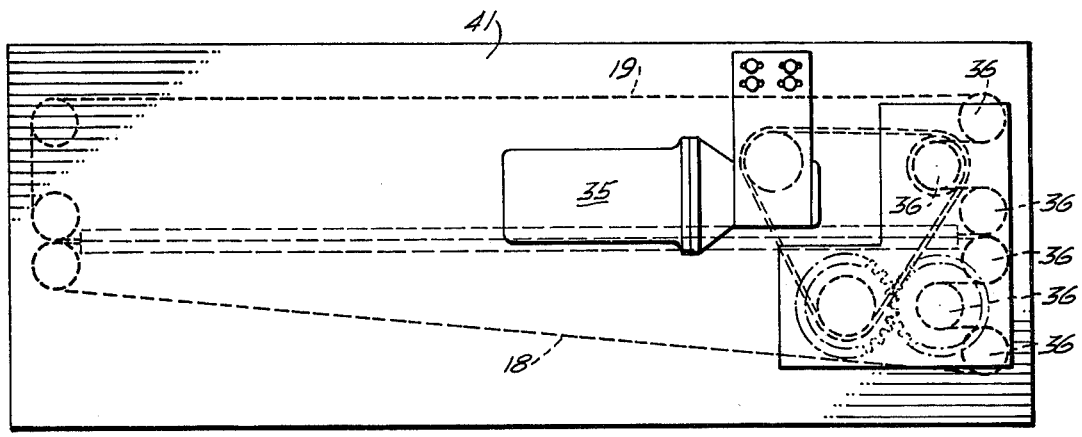
FIG. 5 is a partially diagrammatic view illustrating the drive mechanism for the carrier belts.

Turning now to FIG. 5 it will be seen that the upper and lower belts 18, 19 are driven by a belt motor 35 through a given sprocket mechanism to a plurality of belt pulleys 36. The upper belt and lower belt 18, 19 are reeved around the pulleys 36 to insure a firm flow and continuous drive. The motor bracket 38 permits some adjustment of the belt motor 35, and cooperates with the idler adjustment 40 (see FIG. 1) to adjustably secure the tension and frictional engagement of the belts 18, 19 with the pulleys 36.

Figure 6:
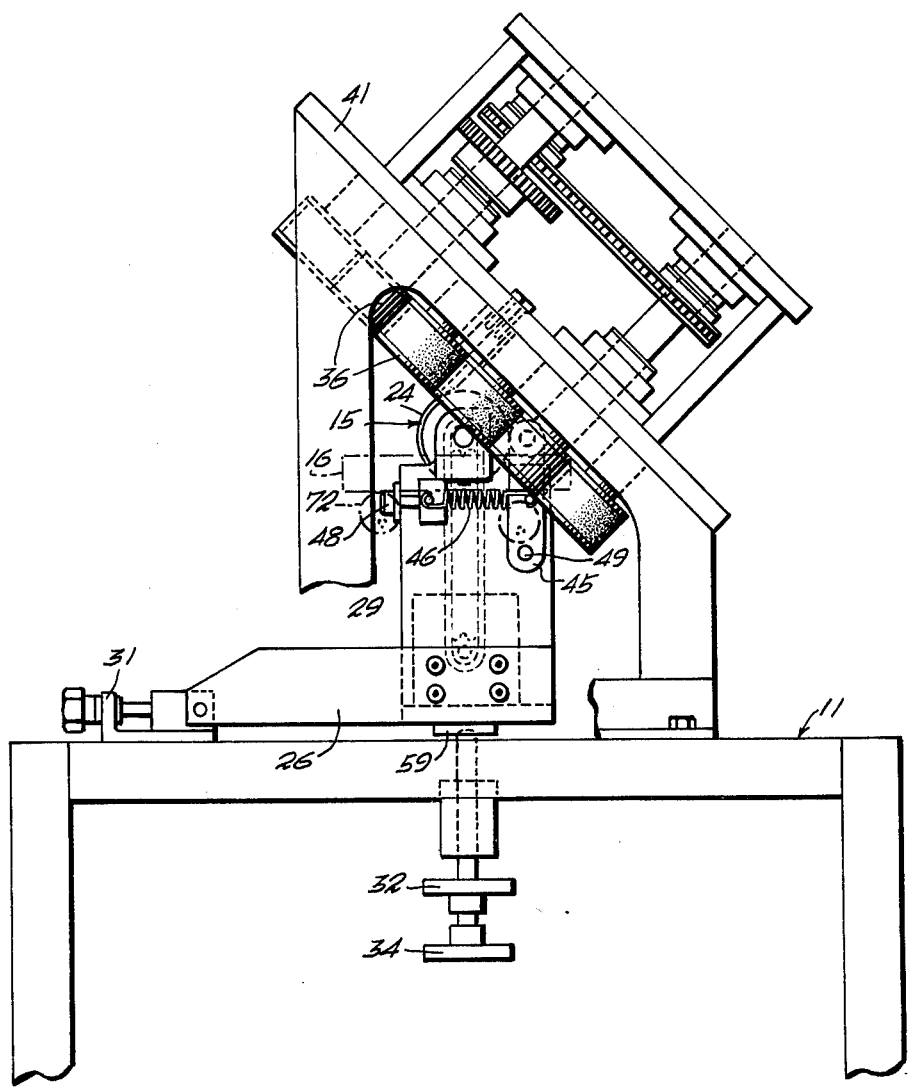
FIG. 6 is an end view of the mechanism shown in FIGS. 3 and 4 in slightly enlarged scale.
Figure 7:
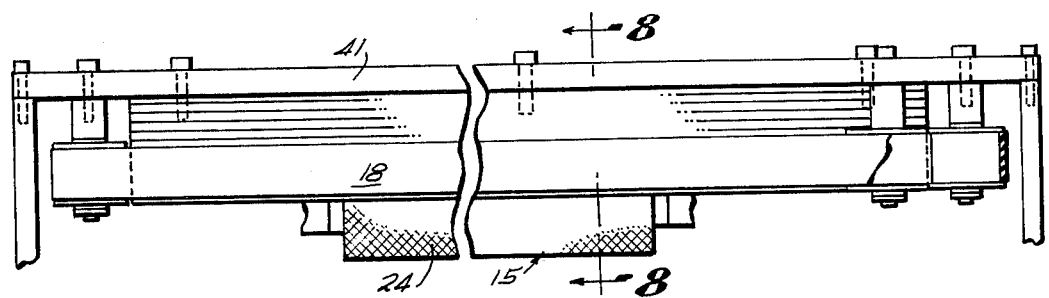
FIG. 7 is a top view of the jaws, driving belt, and anode roller broken at the midportion thereof.

In FIG. 6 the bracket 45 for the metering rollers disclosed, the same being urged by the spring 46 into compressive relationship with the roller 15. An adjustment nut 48 is provided to further adjust the yieldable relationship between the metering roll 22 and the anode roller 15, the bracket 45 being pivoted around pivot point 49.

Figure 2:
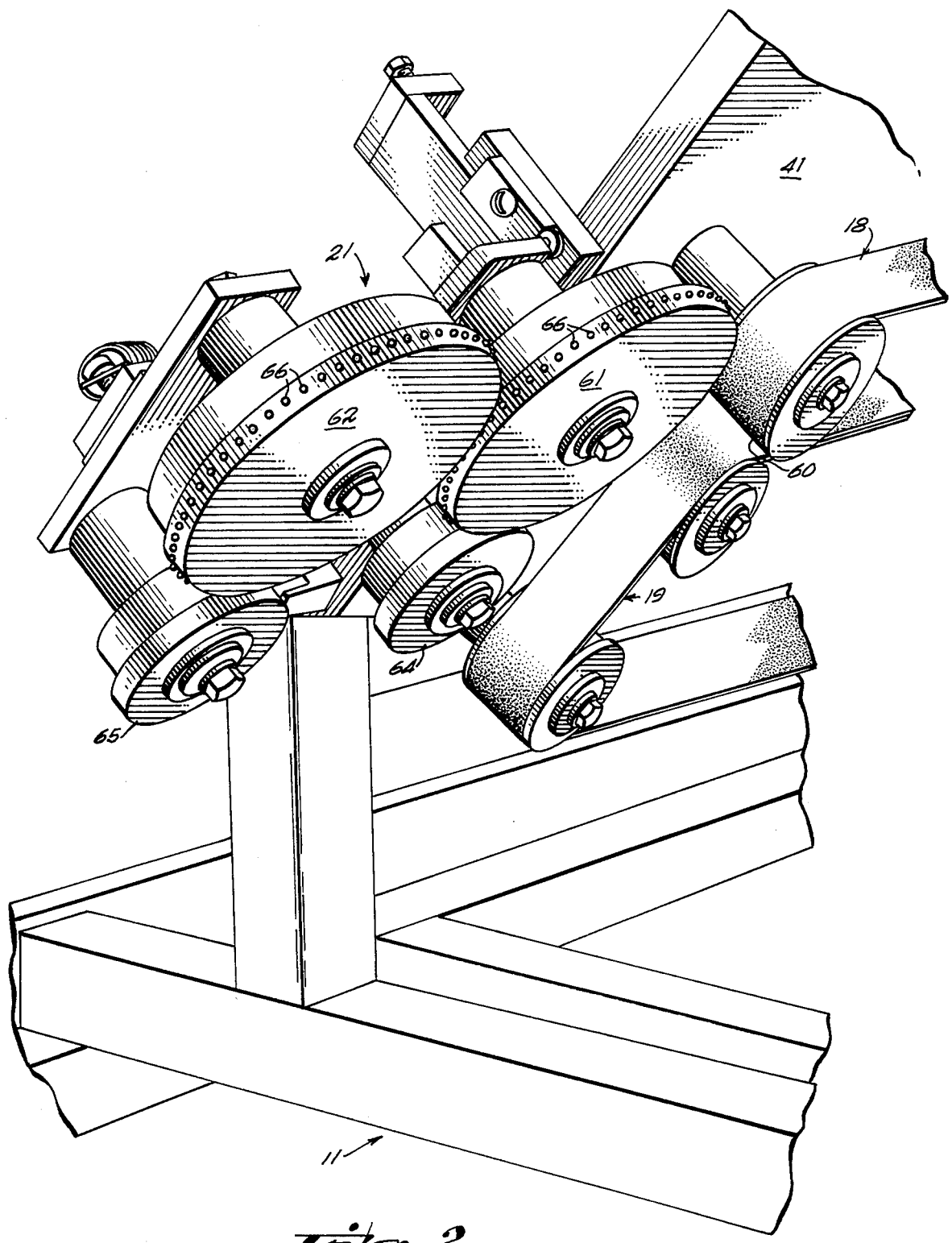
FIG. 2 is an enlarged partially broken view illustrating the feed guide for delivering a plurality of bandolier secured contact points to the opposed driving belts.

It is highly desirable to lead the bandolier 50 into the feed point 60 defined by the position where the upper belt 18 and lower belt 19 come together, the alignment to be as close as possible. It will be appreciated that to accomplish this purpose, a feed guide sprocket assembly 21 may be usefully employed (see FIG. 2). The assembly comprised an upper inner toothed wheel 61 and an upper outer toothed wheel 62. The teeth 66 are positioned circumferentially to penetrate the drive holes 55 of the bandolier 50. The driving effort of the upper and lower belts 18, 19, will rotate the toothed wheel 61, 62, and pull the bandolier 50 between the teeth 66 and the lower inner guide wheel 64 and the outer lower guide wheel 65. Other alternatives are available for the feed guide 21, such as a pair of opposed plates. The principal result to be achieved is one of presenting the bandolier 50 in a path substantially coincident with the feed point 60, and the trace of the upper and lower belts 18, 19 as they pass through the opposed jaws 42, 44.

For purposes of cleaning, an eccentric tray mount assembly 70 (see FIG. 1) in which a single crank 71 may be rotated to the end that the four contact rollers 72 supporting the tray 16 lower their contact points, and the tray 16 may be removed from its fluid bath relationship with the roller 15 for cleaning, replenishing the electrolytic solution, or otherwise engaging in the maintenance and operation of the subject continuous plater 10.

Although particular embodiments of the invention have been shown and described in full here, there is no intention to thereby limit the invention to the details of such embodiments. On the contrary, the intention is to cover all modifications, alternatives, embodiments, usages and equivalents of a continuous contact plater and method as fall within the spirit and scope of the invention, specification and the appended claims.

What is claimed is:

1. A method for a continuous plating of a discreet area on a convex curvilinear surface on a plurality of aligned electronic contacts comprising the steps of:
   confining the contact points in close proximate parallel relationship with a fixed axis of travel of the points to be plated,
   firmly engaging the same thus oriented contact points by means of opposed pressure belts drivingly engaged to move the thus oriented contact points with their discreet convex curvilinear portions to be plated firmly against a plating member, while cantileveringly extending from the belts, positioning a fluid retaining sleeve on a roller in anode rotary relationship to the contact point, rotating the roller to pass a retained plating solution in said sleeve against the contact points on a convex curvilinear tangential point, electrically energizing the contact points as a cathode and passing the same longitudinally against the rotation of the roller thereby defining a helical path across the roller, applying a consistent amount of fluid on the roller sleeve and maintaining a bath of fluid on the roller sleeve to constantly wet the same in a controllable electrodeposition quantity, whereby a contact point can be plated with a metal such as gold in the discreet curvilinear portion intended for electrical contact with another member and without plating the rear portion or other portions of the contact which otherwise have no electrical relationship in a circuit.

2. In the method of claim 1,
using gold as the plating metal.

3. In the method of claim 1,
using a longitudinal carrying strip to secure the contacts in alignment.

4. In the method of claim 1,
using opposed jaws in frictional engagement with the opposed belts to grasp the belt and contacts.

5. In the method of claim 2,
using a longitudinal carrying strip to secure the contacts in alignment.

6. In the method of claim 2,
using opposed jaws in frictional engagement with the opposed belts to grasp the belt and contacts.

7. In the method of claim 3,
using opposed jaws in frictional engagement with the opposed belts to grasp the belt and contacts.

* * * * *